United States Patent [19]

Baum

[11] 4,441,076

[45] Apr. 3, 1984

[54] MOTION DETECTION APPARATUS FOR ELECTRIC MOTORS

[76] Inventor: Matthew C. Baum, 861 Washington Ave., Washington Township, Bergen County, N.J. 07675

[21] Appl. No.: 196,834

[22] Filed: Oct. 14, 1980

[51] Int. Cl.³ .................... G01R 31/02; G08B 21/00; H02H 7/09
[52] U.S. Cl. .............................. 324/158 MG; 324/51; 340/648; 361/33
[58] Field of Search ........... 324/158 MG, 51; 322/99; 340/648; 361/23, 30, 31, 33

[56] References Cited

U.S. PATENT DOCUMENTS 4,314,193 2/1982 Mortonson ................. 324/158 MG

Primary Examiner—Ernest F. Karlsen
Attorney, Agent, or Firm—Arthur I. Degenholtz

[57] ABSTRACT

An apparatus for detecting and indicating the motion of electric motors includes a voltage sensing module which can be connected to the power terminals of any known type of electric motor and a display module. In the primary embodiment of the invention the voltage sensing module senses the applied or self-generated voltages present between the motor windings, and when no voltage is present, the display module provides an output which may be an electrical signal, or a visual, tactile or audible display. The apparatus is inherently reliable and fail-safe. A failure of components within the apparatus causes a display module output indicative that the motor is running when in fact it is stationary.

14 Claims, 5 Drawing Figures

MOTION DETECTION APPARATUS FOR ELECTRIC MOTORS

BACKGROUND OF THE INVENTION

The invention relates to an apparatus for testing an electric motor to detect the presence of motion without a need for the addition of mechanical components to the motor.

The widespread use of electric motors in various types of machinery and equipment has led to a need for a simple and reliable means for determining and indicating to an operator whether or not the motor is in motion. This need is readily apparent in the field of motor-driven machinery which is of a size such that the inertia of the motor and, the various machine elements causes the motor to continue to rotate, or coast, for a time after the motor power has been disconnected. An operator of such a machine, after shutting off the power to the motor, often tends to forget about or to disregard these inertia effects and thinking that the machine is at rest, may place his hands or a portion of his body in a location which can result in an accident. Because of the critical relationship of the motion of the electrical motor and the machine to the safety of the operator, a desirable motion detector, in addition to being inherently highly reliable, must also have failure modes which result in an indication that there is motion of the motor even when in fact the motor is stationary. In addition, a desirable motion detector, in order to gain acceptance as a safety device, must be relatively simple to install and must not impede the normal operation of the motor. This requirement, in connection with the requirement for high reliability, rules out the use of conventional mechanical components such as revolution counters and the like.

OBJECTS OF THE INVENTION

It is an object of the invention to provide a fail-safe apparatus for detecting the motion of an electric motor.

Another object of the invention is to provide an inherently reliable apparatus for detecting the motion of an electric motor.

Another object of the invention is to provide an apparatus for detecting the motion of an electric motor which incorporates an output device for a visual, audible or a tactile indication of the rotation of the shaft of the electric motor.

Another object of the invention is to provide an apparatus for detecting the motion of an electric motor which has a failure mode in which the apparatus indicates that motion of the motor is present even though the electric motor is in fact stationary.

Another object of the invention is to provide an apparatus for detecting the motion of an electric motor which does not rely on the addition of mechanical components to the electric motor and which is extremely simple to install on existing machinery.

Another object of the invention is to provide an apparatus for detecting the motion of a motor which will operate on any known type of electric motor including induction motors, DC motors, universal motors, linear motors and stepping motors.

Still another object of the invention is to provide an apparatus for detecting the motion of an electric motor which is composed of a relatively small number of component parts and which can be manufactured economically at a relatively low unit cost.

SUMMARY OF THE INVENTION

In accordance with the present invention there is provided an apparatus for detecting the motion of an electric motor which comprises a sensing module and a display module. The sensing module includes at least one channel or circuit which examines the applied or self-generated voltages present between one or more pairs of motor windings. Each channel of the sensing module includes an overvoltage protector, an input amplifier and input broken wire detector, a spike rejection circuit, a window discriminator and an output detector with a time delay. The sensing module also includes combining logic and coupling means which combine the outputs of the individual channels and provide isolation between the output signals and the display module. The display module is connected electrically to the sensing module and provides a visual, audible or tactile indication of the motion of the motor.

In the primary embodiment, a pair of channels is provided as described above and a common reference voltage circuit is connected to each of the window discriminator modules.

Additional objects and advantages of the invention will become apparent during the course of the following specification, when taken in connection with the accompanying drawings in which:

DETAILED DESCRIPTION OF THE INVENTION

Figure 1:
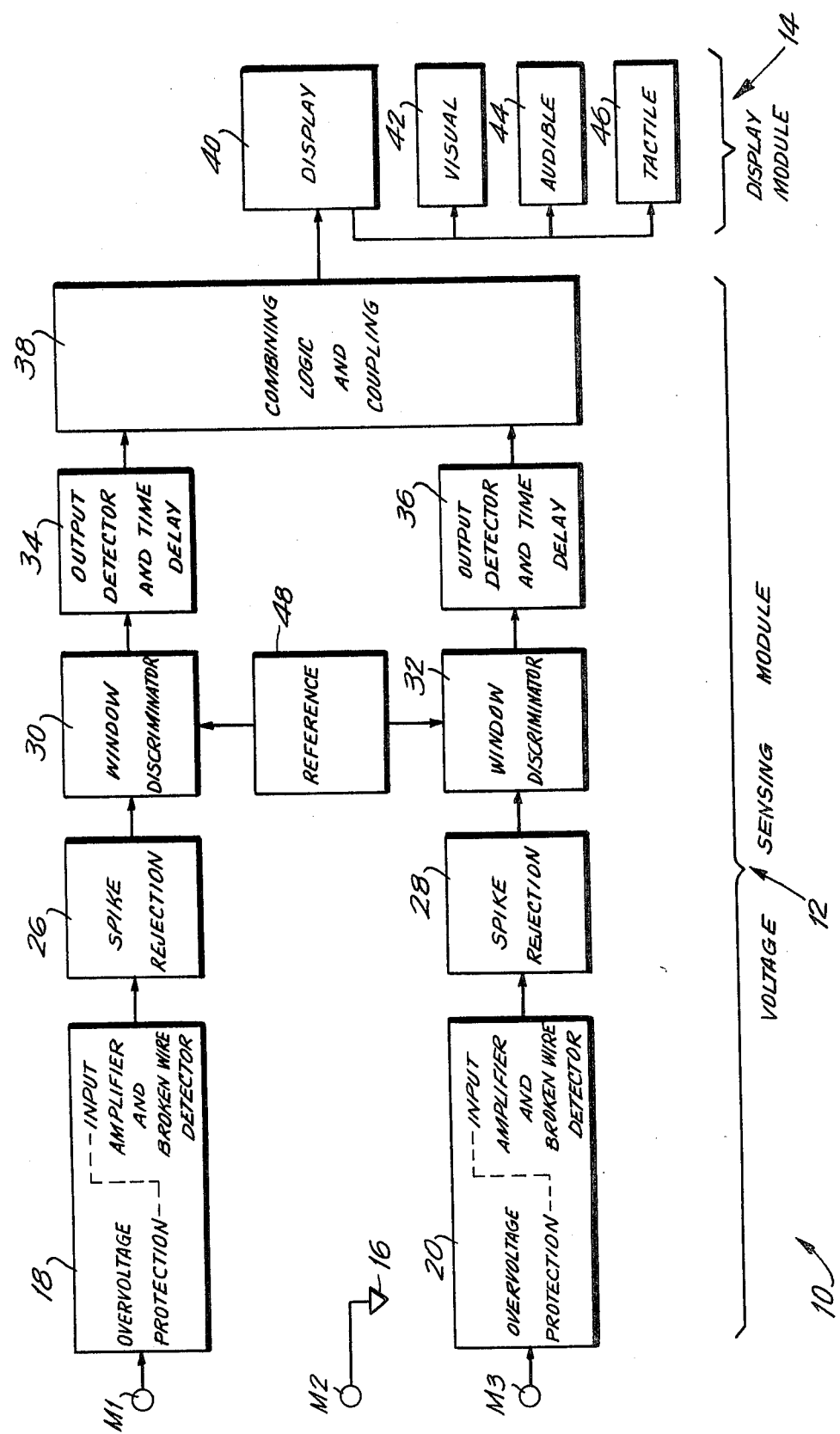
FIG. 1 is a functional block diagram of an apparatus for detecting and indicating the motion of electric motors.
Figure 2:
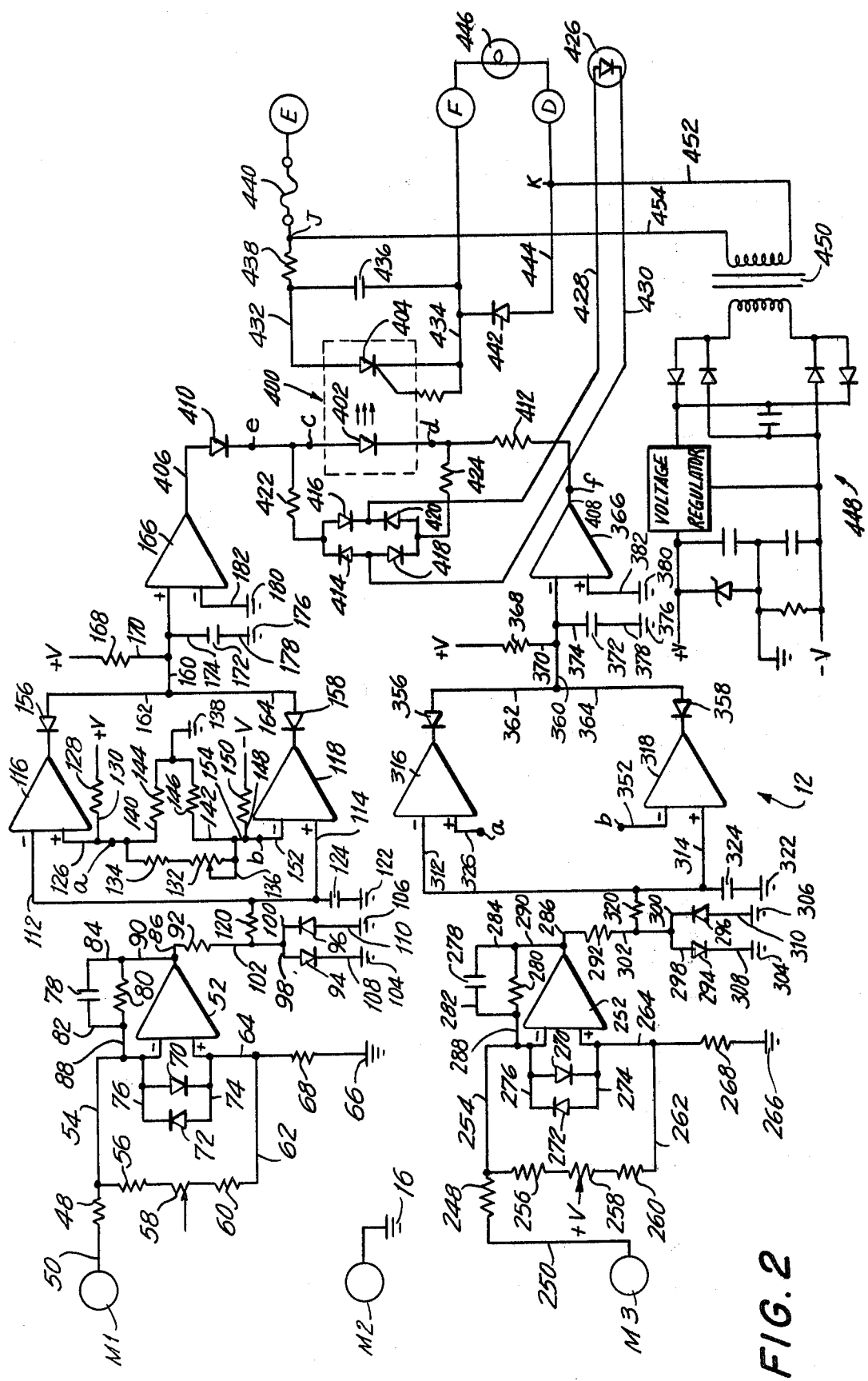
FIG. 2 is a schematic diagram of the apparatus of FIG. 1.

With reference to the drawings, there is shown in FIG. 1 a functional block diagram of a motion detection apparatus 10 for electric motors, the electrical circuits of which are shown in FIG. 2. The motion detection apparatus 10 is shown connected to the terminals M1, M2 and M3 of an electric motor which may be of the induction, DC, universal, linear, stepping, or any other type, and generally comprises a voltage sensing module 12 and a display module 14.

The voltage sensing module 12 comprises one or more separate circuits which examine the self-generated voltages present between one or more pairs of the motor windings or motor terminals. The voltage sensing module 12 shown in FIG. 1 is connected to motor terminals M1, M2 and M3. In a single phase motor, or a motor having only a single accessible winding terminal, M1 and M3 may be connected together so that both sense the same input. The terminal M2 is connected to common reference 16. Terminals M1 and M3 are each connected to a channel which includes the following circuits or components: overvoltage protection circuit 18, 20, input amplifier and broken wire detector circuit 22, 24, spike rejection circuit 26, 28, window discriminator circuit 34, 36. The two output detector and time delay circuits 34, 36 are fed to a combining logic and coupling circuit 38, which in turn is connected to a display module 40. The display module may be of a type which presents a visual 42, audible 44 or tactile 46 display or any combination of the above in response to input signals from the combining logic and coupling circuit 38. A reference voltage circuit 48 is connected to the window discriminator circuits 30, 32.

With reference to FIG. 2, the circuits shown in block diagram form in FIG. 1 are illustrated in detail. The voltage sensing module 12 is connected to motor terminals M1, M2, and M3. As indicated previously, the circuits connected to terminals M1 and M3 are identical, and terminal M2 is used as the local reference 16 or common. The circuits connected to terminal M1 are designated as the first channel for purposes of description and the circuits connected to terminal M3 are designated as the second channel.

The terminal M1 is connected to a resistor 48 via a lead 50. The resistor 48 is connected to the input of a difference amplifier 52 via a lead 54. A resistor 56 is connected to an intermediate portion of the lead 54 and to a potentiometer 58. The potentiometer 58 is connected in series to a resistor 60 which in turn is connected via a lead 62 to an intermediate portion of a lead 64 which is connected to a second input of the difference amplifier 52. The lead 64 is connected to the ground 66 via a resistor 68. An intermediate portion of the lead 64 is also connected to the cathode of a diode 70 and to the anode of a diode 72 via a lead 74. The cathode of the diode 72, and the anode of the diode 70 are connected to the lead 54 via the lead 76.

A capacitor 78 and a resistor 80 are connected in parallel via the leads 82, 84 and the parallel combination of the resistor 80 and the capacitor 78 are connected to the input lead 54 and the output lead 86 of the difference amplifier 52 via the leads 88, 90. The output lead 86 of the difference amplifier 52 is connected to a resistor 92. The resistor 92 is connected to the anode of diode 94 and to the cathode of diode 96 via the leads 98, 100, 102. The cathode of the diode 94 and the anode of the diode 96 are connected to the grounds 104, 106 via the leads 108, 110.

An intermediate portion of the lead 102 is connected to the input leads 112, 114 of comparators 116, 118 via a resistor 120. The input leads 112, 114 are connected to a ground 122 via a capacitor 124. The second input lead 126 of the comparator 116 is connected to a positive reference voltage, designated +V, via a resistor 128 and a lead 130, and to a potentiometer 132 via a resistor 134. The potentiometer 132 and the slider 136 of the potentiometer 132 are connected to the ground 138 via the leads 140, 142 and the resistors 134, 144, 146 and to a negative reference voltage, designated −V, via the lead 148 and the resistor 150. The potentiometer 132 and slider 138 are connected to the second input lead 152 of the comparator 118 via the lead 154.

The outputs of the comparators 116, 118 are connected to the cathodes of the diodes 156, 158, the anodes of which are connected to the lead 160 via the leads 162 and 164. The lead 160 is connected to the input of amplifier 166. An intermediate portion of the lead 160 is connected to a resistor 168 via a lead 170, which in turn is connected to a reference voltage designated +V. Another intermediate portion of the lead 160 is connected to a capacitor 172 via lead 174 and the capacitor 172 is connected to the ground 176 via the lead 178. A second input to the amplifier 166 is connected to the ground 180 via the lead 182.

The output of the amplifier 166 of the first channel and the output of the amplifier 366 of the second channel are fed to the combining circuit 38 which will be described presently.

As indicated above, the circuits of the second channel are identical to the circuits of the first channel. The circuits of the second channel will be described for reference.

The terminal M3 is connected to a resistor 248 via a lead 250. The resistor 248 is connected to the input of a difference amplifier 252 via a lead 254. A resistor 256 is connected to an intermediate portion of the lead 254 and to a potentiometer 258. The potentiometer 258 is connected in series to a resistor 260 which in turn is connected to an intermediate portion of a lead 264 which is connected to a second input of the difference amplifier 252. The lead 264 is connected to the ground 266 via a resistor 268. An intermediate portion of the lead 264 is also connected to the cathode of a diode 270 and to the anode of a diode 272. The cathode of the diode 272, and the anode of the diode 270 are connected to the lead 254 via the lead 276.

A capacitor 278 and a resistor 280 are connected in parallel via the leads 282, 284 and the parallel combination of the resistor 280 and the capacitor 278 are connected to the input lead 254 and the output lead 286 of the difference amplifier 252 via the leads 288, 290. The output lead 286 of the difference amplifier 252 is connected to a resistor 292.

The resistor 292 is connected to the anode of diode 294 and to the cathode of diode 296 via the leads 298, 300, 302. The cathode of the diode 294 and the anode of the diode 296 are connected to the grounds 304, 306 via the leads 308, 310.

An intermediate portion of the lead 302 is connected to the input leads 312, 314 of the comparators 316, 318 via a resistor 320. The input leads 312, 314 are connected to a ground 322 via a capacitor 324. The end of the second input lead 326 of the comparator 316 is designated by the reference letter "a" and is connected to the lead 126 at the location designated by the reference letter "a" on that lead. Similarly the end of the second input lead 352 of the comparator 318 is designated by the reference letter "b" and is connected to the lead 136 at the location designated by the reference letter "b" on that lead.

The outputs of the comparators 316, 318 are connected to the cathodes of the diodes 356, 358, the anodes of which are connected to the lead 360 via the leads 362 and 364. The lead 360 is connected to the input of amplifier 366. An intermediate portion of the lead 360 is connected to a resistor 368 via a lead 370, which in turn is connected to reference voltage designated +V. Another intermediate portion of the lead 360 is connected to a capacitor 372 via a lead 374 and the capacitor 372 is connected to the ground 376 via the lead 378. A second input to the amplifier 366 is connected to the ground 380 via the lead 382.

The outputs of the two channels are fed to an optocoupler 400 which includes the light-emitting diode 402 and the silicon-controlled rectifier 404 via the leads 406 and 408, respectively. The lead 406 is connected to a diode 410 and the lead 408 is connected to a resistor 412. A bridge circuit consisting of the diodes 414, 416, 418 and 420 is connected to the optocoupler diode 402 via the resistors 422 and 424. The output of the bridge circuit is connected to a light-emitting diode, LED, indicator 426 via the leads 428 and 430.

The leads 432, 434 carry the output of the optocoupler 400. A capacitor 436 is connected across the leads 432, 434. The lead 432 is connected to the resistor 438 which is connected in series to the fuse 440 and the output terminal E. The lead 434 is connected to the output terminal F. An intermediate portion of the lead 434 is connected to the diode 442 which, in turn, is connected to the output terminal D via the lead 444. The load of the display module 40, which is indicated by way of example, as the lamp 446 is connected across the output terminals D and F.

A power supply circuit 448 is connected via a transformer 450 and the leads 452, 454 to the leads 432, 444. The power supply circuit 448 also provides the +V and −V operating and reference voltages previously indicated. The power supply circuit 448 is conventional in nature and will not be described in detail.

In the preferred embodiment of the invention the display module 40 is connected to the output terminals D and F and includes an illuminated message which may be MOTOR NOT RUNNING or a similar message. This visual display is illuminated when the motion of the motor ceases.

In alternative embodiments the display module 40 may include, in addition to, or instead of the visual display 42 an audible horn 44 or siren or a tactile device 46 such as a piezo-electric electric or electro-mechanical vibrator.

The operation of the circuits will now be described with reference to FIG. 2. In use, the apparatus 10 senses the running voltage, electronic braking voltage or the self-induced voltage present during coasting. When used on a three-phase motor, the terminals M1, M2 and M3 are connected to the motor wires. When used on a single-phase motor, the terminals M1 and M3 are connected together and to the live side of the motor and the terminal M2 is connected to the neutral or return side of the motor.

The circuits following M1 and M3 are similar and the operation of only the first channel connected to M1 will be described in detail.

An input signal applied to M1 is conducted via the resistor 48 to the input of the difference amplifier 52. To prevent damage to the difference amplifier 52, the resistor 48 is made reasonably large. The diodes 70 and 72 limit the voltage to safe plus and minus values. The resistors 56, 58 and 60 supply constant equal currents to the two inputs of the difference amplifier 52. This results in equal voltages as well, as long as there is a low impedance, or motor winding, between terminals M1 and M2. The imbalance which results if a wire is disconnected is made to be greater than the amount of an expected externally produced input signal.

The resistor 58 is set to compensate for the various offset voltages and variations in the manufacturing of the difference amplifier 52 and the various components, and is adjusted for zero output from the difference amplifier 52 when there is no input present.

The output of the difference amplifier 52 is filtered to remove sharp spikes and noise by the network of resistor 92 and diodes 94 and 96 and is applied to the inputs of the comparators 116 and 118. The positive and negative acceptance values of the discriminator comprising comparators 116 and 118 are set by the resistors 128, 144, 146 and 150. The same references are used by the second channel as indicated by the connections shown by the reference letters "a" and "b". The references may be adjusted downward in absolute value by means of the shunting sensitivity potentiometer 132 with the minimum set by the resistor 134.

Figure 4:
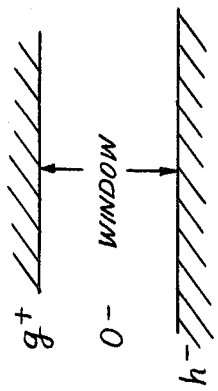
FIG. 4 is a representation of a signal discrimination window which is a part of the function of the apparatus of FIG. 1.

The window or range of acceptable values is shown diagrammatically in FIG. 4.

The output amplifier 166 is normally biased in a preferred way. The output amplifier 366 of the second channel is biased in the opposite way. This bias can be overcome when either comparator output causes diode 156 or 158 to conduct. Although the capacitor 172 can be discharged quickly, it charges at a rate limited by the resistor 168. The comparator outputs will hold the capacitor 172 near the negative supply rail in other than null condition. At null, the capacitor 172 will charge toward the positive rail. The discrimination at the output is conveniently done around zero.

The outputs from the two channels move in opposite directions. In the null input state; the output of the amplifier 166 is high while that of amplifier 366 is low. Thus, the opto-coupler 400 is forward biased. When either channel alone produces an output there is no net voltage produced across the resistor 412 and the opto-coupler diode 402. Only when both channels cooperate will the output be triggered. Also, should channel 1 fail so that its output is always high, or channel 2 fail so that its output is always low, the apparatus 10 will continue to operate normally. Should channel 1 fail so that its output is always low or channel 2 fail so that its output is always high, no output will be possible. Thus, a single failure can not produce a false alarm output.

The bridge circuit comprising diodes 414, 416, 418, and 420 is connected to a light emitting diode, LED, 426 which indicates that the two sides, or channels, are truly opposed in voltage. A failure of either channel will de-activate the LED 426 for either the null or off-null condition.

Current through the opto-coupler diode 402 causes the opto-coupler SCR 404 to fire, completing a path between terminals E and F. This half-wave alternating current may be used to light a lamp 446 connected to terminals D and F, if power is supplied to D and E. Other output devices such as audible indicators, including horns, or tactile indicators such as piezo-electric or mechanical vibrators, may be used in addition to or instead of the lamp 446.

A common failure mode of SCR's is to become a short circuit. In this case, the output would tend to be full-wave alternating current. This causes the diode 442 across terminals D and F to conduct. The current is limited by resistor 438 and is set to cause the fuse 440 to blow. If too large a fuse is inadvertently used, the resistor 438 may be proportioned to fail on excess power.

Figure 3:
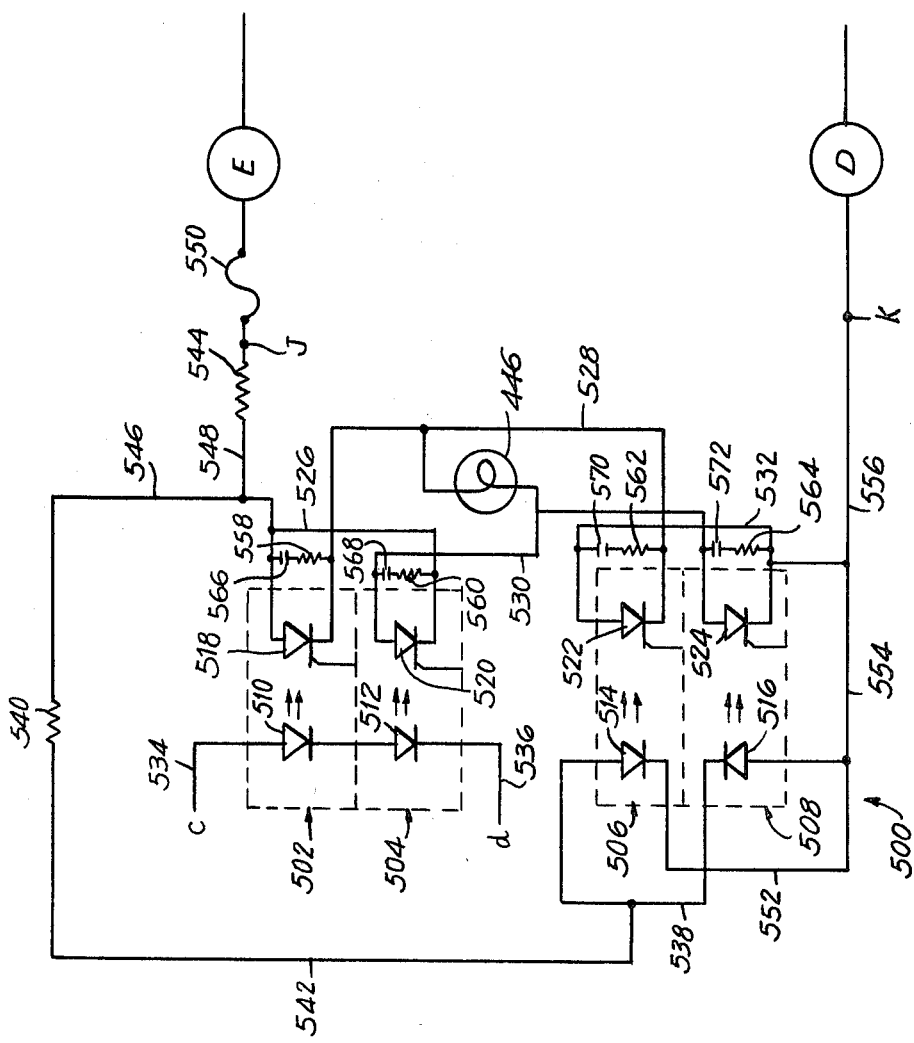
FIG. 3 is a schematic diagram of an alternative output section of the apparatus of FIG. 2.

FIG. 3 shows an alternative output circuit 500 which may be used in the event that a full-wave output is required. The output circuit 500 includes terminals c and d which may be connected to the reference locations c and d, respectively, of FIG. 2. When the output circuit 500 of FIG. 3 is utilized, the following components shown in FIG. 2 are eliminated: opto-coupler coupler 400, capacitor 436, diode 442, resistor 438, fuse 440 and terminals E, F and D. The load which is indicated by the lamp 446 of the display module is connected as shown in FIG. 3. The output circuit 500 of FIG. 3 includes four optocouplers 502, 504, 506, 508 which contain diodes 510, 512, 514, 516 and silicon controlled rectifiers 518, 520, 522, 524. The silicon controlled rectifiers 518, 520, 522, 524 are connected as a bridge, with the anode of SCR 518 connected to the cathode of SCR 520 via the lead 526, the cathode of SCR 518 connected to the cathode of SCR 522 via the lead 528, the anode of SCR 520 connected to the anode of SCR 524 via the lead 530, and the anode of SCR 522 connected to the cathode of SCR 524 via the lead 532.

The diodes 510, 512 of the optocouplers 502, 504 which excite the SCR 518, 520, respectively, are connected in series across the terminal points c and d via the lead 534 and 536. The anode of the diode 514 is connected to the cathode of the diode 516 via the lead 538 and to the resistor 540 via the lead 542. The resistor 540 is connected to the lead 526 and to the resistor 544 via the leads 546 and 548. The resistor 544 is connected in series to the fuse 550 and the terminal E. The cathode of the diode 514 and the anode of the diode 516 are connected to the terminal D via the leads 552, 554 and 556.

AC power is supplied to the terminals D and E. The load which is indicated, by way of example, as the lamp 446, is connected across the leads 528 and 530. It is understood that alternatively other components of the display module in lieu of or in addition to the lamp 446 may be connected to the output leads 528 and 530.

A resistor 558, 560, 562, 564 in series with a capacitor 566, 568, 570, 572 is connected across each of the SCR's 518, 520, 522, 524, respectively.

The lamp 446 receives full wave power as a result of the bridge connection of the SCR's 518, 520, 522, 524. When terminal J is polarized positive, SCR 518 conducts and when terminal J is polarized negative, SCR 520 conducts. In the event that any of the SCR's 518, 520, 522, 524 fail in a short circuit mode, a direct short across the lines 548, 556 is created thereby causing the fuse 550 to blow.

In another alternative embodiment of the invention, which can be utilized in applications where the highest reliability is not needed, the opto-coupler 400 output is eliminated, and an output relay coil is placed across the terminal e and f of FIG. 2. In this embodiment the extremely high reliability of the opto-coupler is replaced by the somewhat lower reliability of the relay device. The advantages of lower cost combined with more versatile output capabilities make this tradeoff attractive in many applications.

Figure 5:
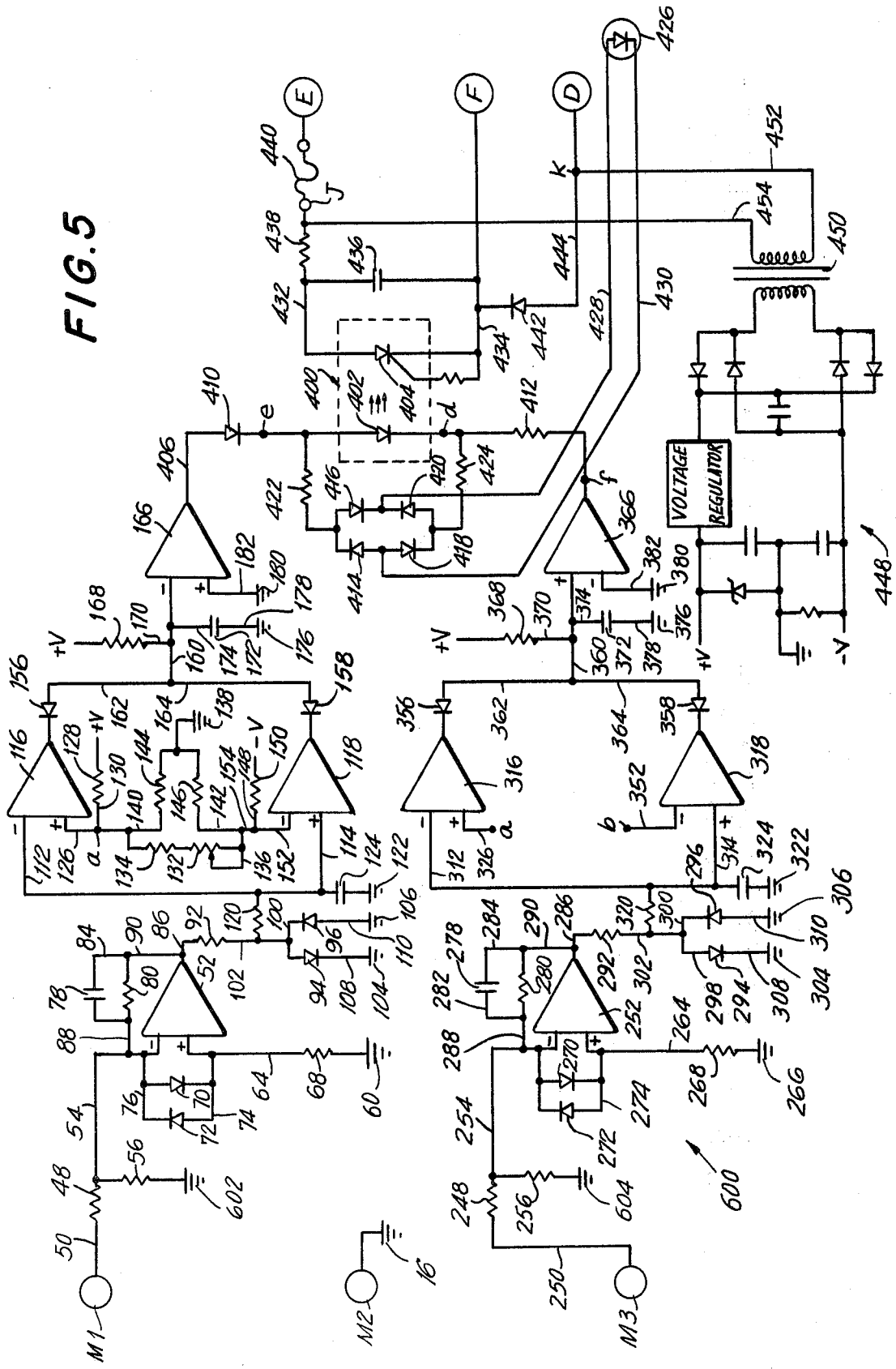
FIG. 5 is a schematic diagram of an alternative embodiment of the apparatus of FIG. 1.

FIG. 5 shows an alternative embodiment 600 of the invention, which is used to indicate that motion of a motor is taking place in applications where lack of motion is undesirable. The circuit diagram, FIG. 5, of the alternative embodiment 600 is generally similar to the circuit diagram, FIG. 2, of the primary embodiment 10 and similar components are denoted by the same reference numerals. In the alternative embodiment 600 the broken wire detection circuits are eliminated resulting in the elimination of the following resistors: 58, 60, 258 and 260.

The resistors 56 and 256 are connected to the grounds 602 and 604, respectively.

In the primary embodiment 10, FIG. 2, an output signal is obtained when the input signal is within the positive, g, and the negative, h, limits of the discriminator window shown in FIG. 4. In the alternative embodiment, 600, FIG. 5, an output signal is obtained when the input signal is outside the limits of the window. The input polarities of the amplifiers 166 and 366 in FIG. 2 are opposite to those in FIG. 5. The output device may be an opto-coupler 400 as is shown, or a relay connected across the terminals e and f as described above.

A potential application for the embodiment of the invention, shown in FIG. 5, is the monitoring of a remote and inaccessible pump where it is important to know that the pump is truly pumping. Since the applied motor driving voltage would activate the apparatus falsely, this voltage is removed temporarily by a conventional electrical disconnect device, which is not shown. The coasting of the pump motor is detected by the apparatus according to the invention as described above and the motor driving voltage is reapplied.

Although indicated by separate reference numerals, for clarity of description, all of the grounds shown in the various FIGS. are at the same potential.

While preferred embodiments of the invention have been shown and described herein, it is obvious that numerous additions, changes and omissions may be made in such embodiments without departing from the spirit and scope of the invention.

What is claimed is:

1. An apparatus for detecting and indicating the motion of an electric motor, comprising: a first channel including
   electrical connection means for connecting to a power terminal of said electric motor,
   overvoltage protection, input amplifier and broken wire detection means connected to said electrical connection means,
   spike rejection means connected to the output of said overvoltage protection, input amplifier and broken wire detection means,
   window discriminator means disposed to pass voltages falling between a selected high limit and a selected low limit, with said window discriminator means connected to the output of said spike rejection means,
   output detector and time delay means connected to the output of said window discriminator means and disposed to detect output from said window discriminator means and provide an output after a preselected time delay,
   output terminal means having at least one pair of output terminals with said output terminal means connected to the output of said output detector and time delay means with said output terminal means disposed to complete a circuit between said output terminals responsive to an output from said output detector and time delay means,
   power supply means connected to said output terminal means and output display means connected to said output terminal means and disposed to provide an indication responsive to a lack of voltage present at said power terminals of said electric motor.

2. An apparatus for detecting and indicating the motion of an electric motor according to claim 1 further comprising:
   a second input channel identical to said first input channel,
   combining logic and coupling means connected to said output detector and time delay means of said first input channel and said output detector and time delay means of said second input channel with said combining logic and coupling means disposed to activate said output terminal means responsive to an output from both said input channels and activating said display means to provide an indication responsive to a lack of voltage present at said power terminals of said electric motor.

3. An apparatus according to claim 2 for use on single phase electric motors in which electrical connection means are provided for connecting together said electrical connection means of said first channel and said second channel.

4. An apparatus according to claim 2 further comprising second display means connected to said coupling means and disposed to continually display an indication responsive to operation of both of said channels.

5. An apparatus according to claim 2 in which said output coupling means includes silicon controlled rectifier means.

6. An apparatus according to claim 5 in which said coupling means further includes diode means and fuse means connected to said controlled rectifier means so that a short circuit failure of said controlled rectifier means causes said diode means to conduct and causes said fuse to blow.

7. An apparatus according to claim 6 further comprising resistor means connected to said fuse means with said resistor means proportioned so that replacement of said fuse means by inappropriately large fuse means causes said resistor means to burn out.

8. An apparatus according to claim 2 further comprising reference voltage means connected to said window discriminator means of said first channel and said window discriminator means of said second channel.

9. An apparatus according to claim 2 in which said output coupling means includes opto-coupler means.

10. An apparatus according to claim 2 in which said output coupling means includes four opto-coupler means with each of said optocoupler means including controlled rectifier means and with said controlled rectifier means connected in a bridge connection.

11. An apparatus for detecting and indicating the motion of an electric motor according to claim 1 in which said overvoltage protection, input amplifier and broken wire means comprises bridge circuit means,
  difference amplifier means connected to said bridge circuit means, and
  input diode overvoltage protection means connected to said difference amplifier means.

12. An apparatus according to claim 1 in which said input amplifier means comprises a difference amplifier.

13. An apparatus according to claim 1 in which said broken wire detection means are eliminated and said window discriminator means are connected to said input amplifier means, in which said window discriminator means are disposed to pass voltages falling above a selected high limit or below a selected low limit and in which said output means are disposed to provide an indication responsive to presence of voltages falling above and below said high and low limits.

14. An apparatus according to claim 1 further comprising sensitivity adjustment means connecting said window discriminator means of said first input channel and said window discriminator means of said second channel.

* * * * *